United States Patent
Matsunami et al.

(10) Patent No.: US 8,653,579 B2
(45) Date of Patent: Feb. 18, 2014

(54) SEMICONDUCTOR STORAGE DEVICE

(75) Inventors: Junya Matsunami, Yokohama (JP);
Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 13/051,355

(22) Filed: Mar. 18, 2011

(65) Prior Publication Data
US 2011/0298033 A1 Dec. 8, 2011

(30) Foreign Application Priority Data
Jun. 30, 2010 (JP) ................. 2010-150041

(51) Int. Cl.
*H01L 29/788* (2006.01)
(52) U.S. Cl.
USPC .......... 257/316; 257/E29.3; 438/257
(58) Field of Classification Search
USPC ............ 257/316–322, E29.3–E29.307; 438/257–267
See application file for complete search history.

(56) References Cited

U.S. PATENT DOCUMENTS

| | | | |
|---|---|---|---|
| 7,652,319 B2 * | 1/2010 | Tsurumi et al. ............... | 257/315 |
| 7,800,157 B2 | 9/2010 | Ryusenji et al. | |
| 2007/0298568 A1 * | 12/2007 | Mokhlesi ..................... | 438/257 |
| 2010/0084703 A1 | 4/2010 | Tsurumi et al. | |

FOREIGN PATENT DOCUMENTS

| | | |
|---|---|---|
| JP | 2007-27727 | 2/2007 |
| JP | 2008-130676 | 6/2008 |
| JP | 2009-26802 | 2/2009 |
| JP | 2009-218421 | 9/2009 |
| JP | 2009-231300 | 10/2009 |

OTHER PUBLICATIONS

U.S. Appl. No. 13/481,068, filed May 25, 2012, Ohno.
Office Action issued Nov. 14, 2013 in Japanese Patent Application No. 2010-150041 (with English Translation).

* cited by examiner

*Primary Examiner* — Julio J Maldonado
*Assistant Examiner* — Daniel Shook
(74) *Attorney, Agent, or Firm* — Oblon, Spivak, McClelland, Maier & Neustadt, L.L.P.

(57) ABSTRACT

According to one embodiment, a semiconductor storage device includes a charge storage layer, a control gate. The charge storage layer is formed above a semiconductor substrate with first insulating film disposed therebetween. The control gate is formed above the charge storage layer with second insulating film disposed therebetween. The control gate includes a nickel silicide region. The side surface expands outwardly in at least a partial region thereof, and height of the control gate from a portion at which the side surface thereof starts to expand outwardly to a top of the control gate is greater than maximum width of the control gate in a region above the portion at which the side surface starts to expand outwardly.

19 Claims, 9 Drawing Sheets

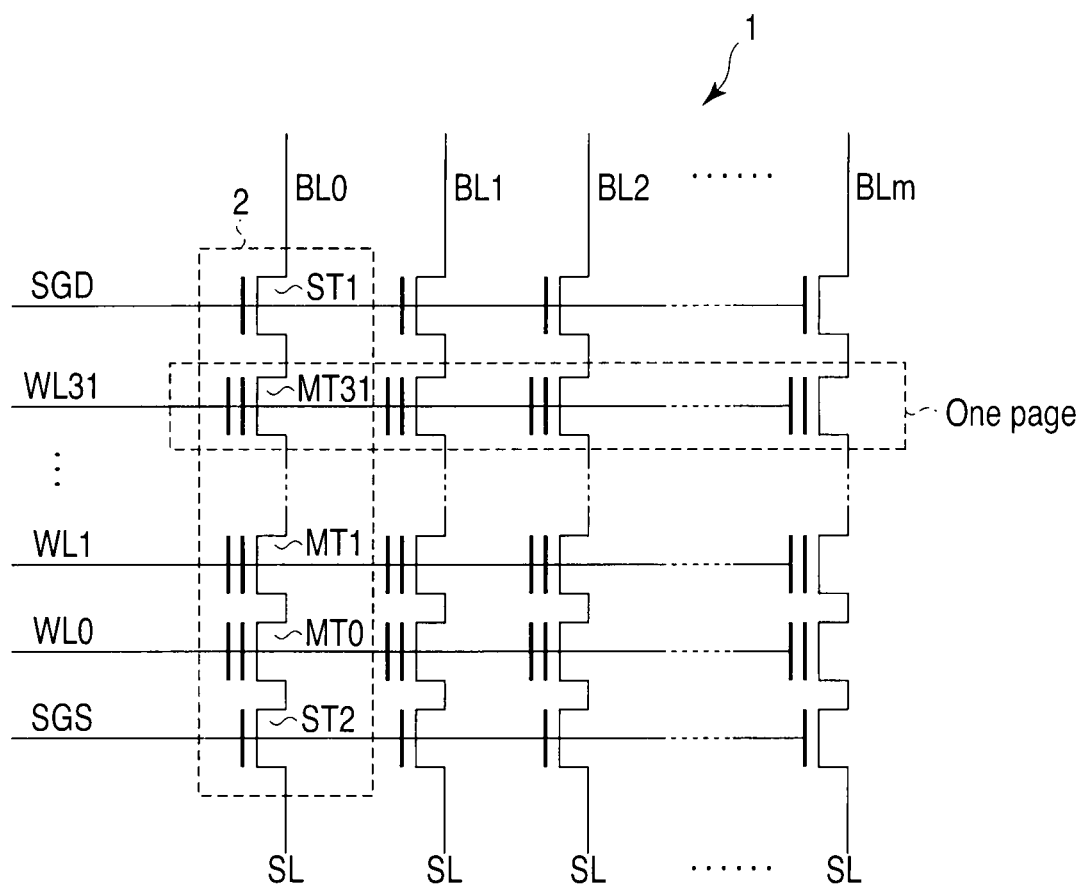
F I G. 1

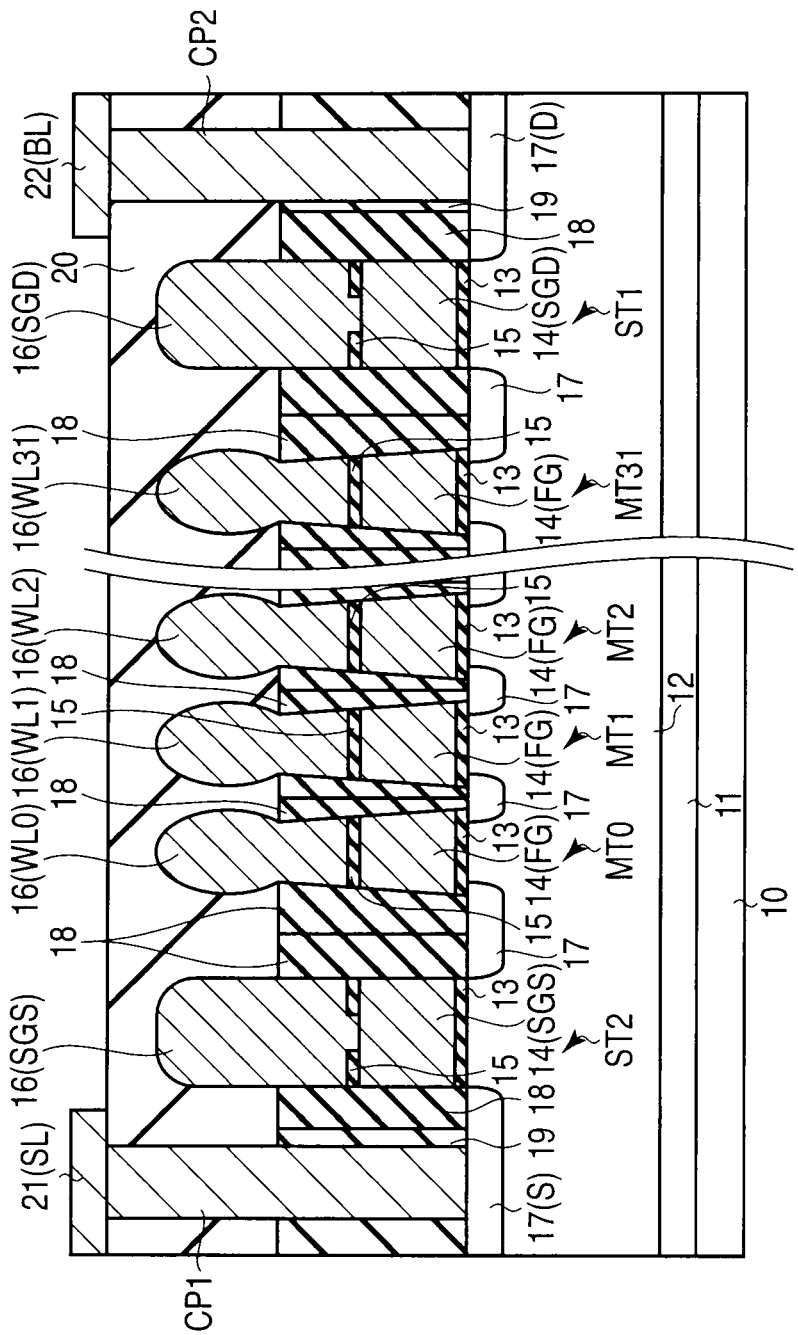
F I G. 2

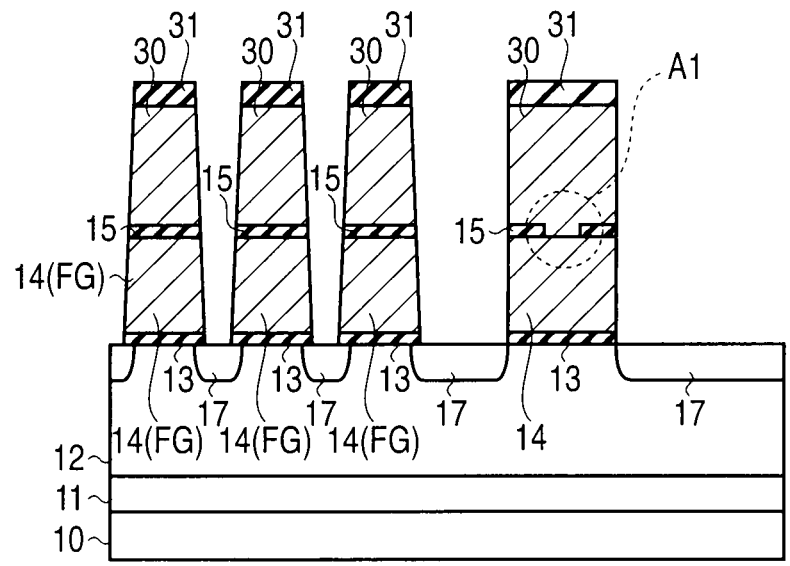
F I G. 5
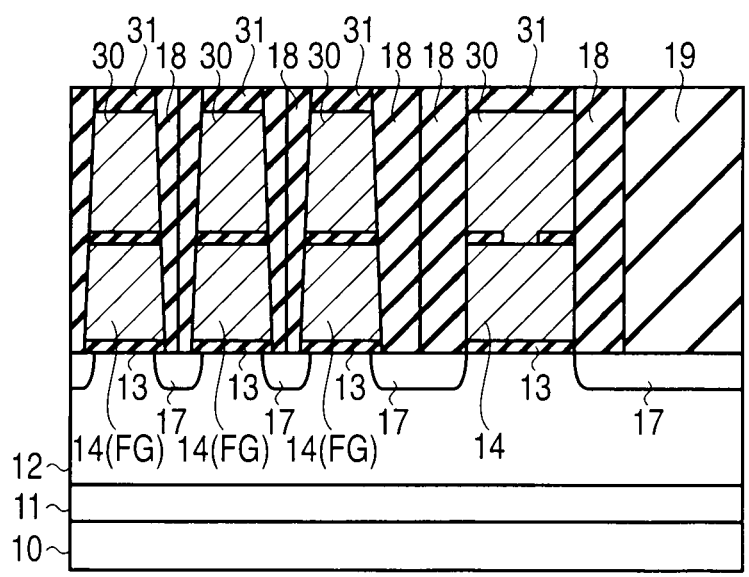
F I G. 6

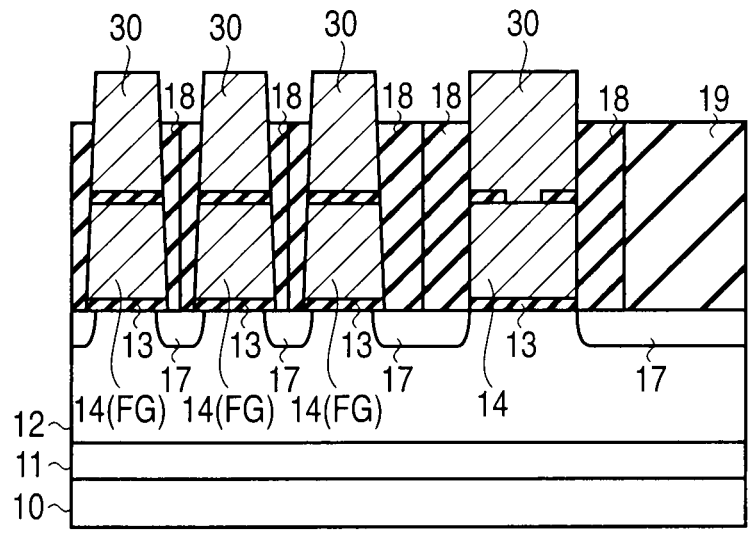
F I G. 7
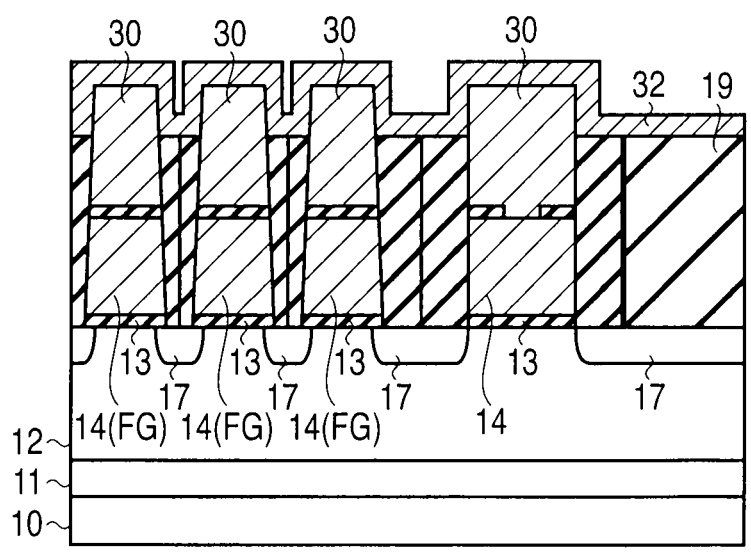
F I G. 8

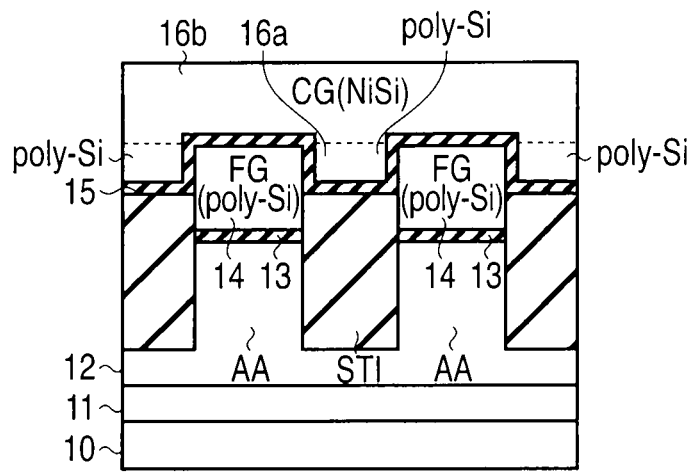
F I G. 11
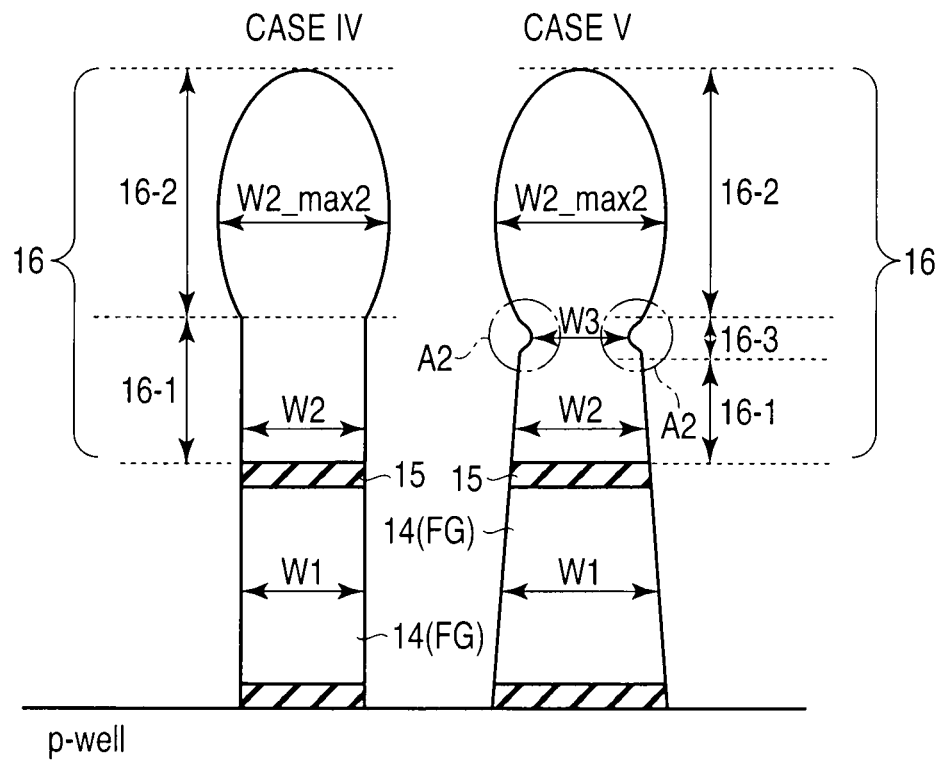
F I G. 12

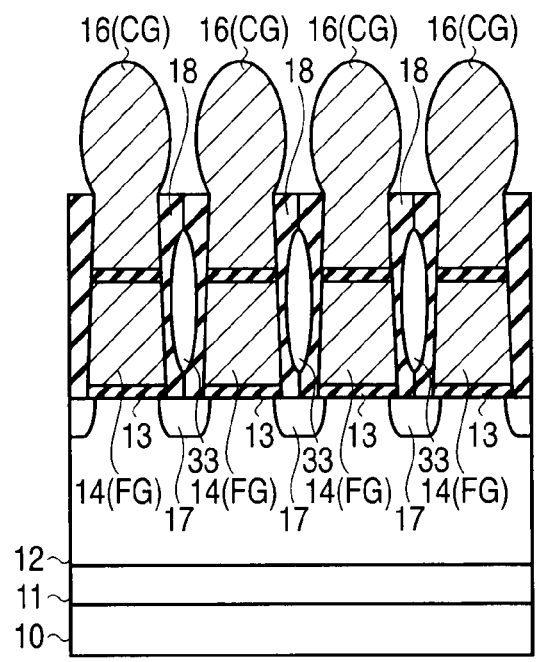
F I G. 15
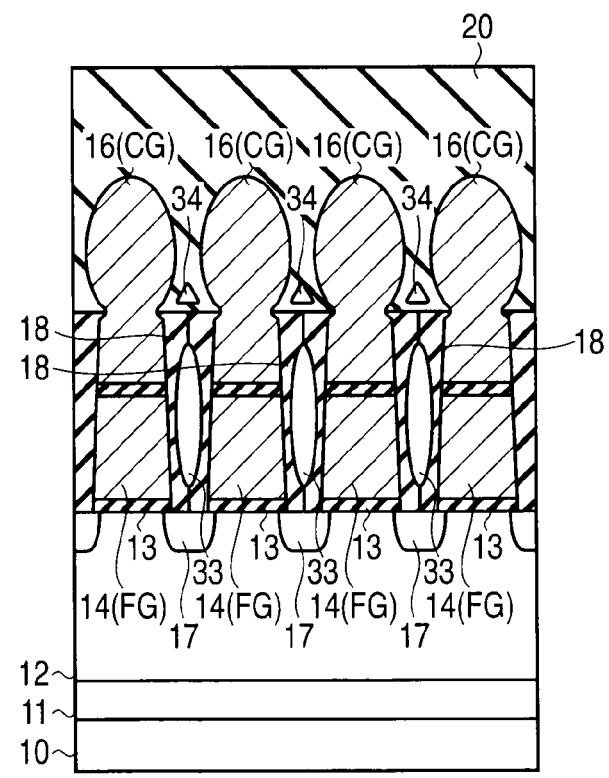
F I G. 16

SEMICONDUCTOR STORAGE DEVICE

CROSS-REFERENCE TO RELATED APPLICATIONS

This application is based upon and claims the benefit of priority from Japanese Patent Application No. 2010-150041, filed Jun. 30, 2010; the entire contents of which are incorporated herein by reference.

FIELD

Embodiments described herein relate generally to a semiconductor storage device.

BACKGROUND

Conventionally, electrically erasable and programmable read-only memories (EEPROMs) are known as examples of nonvolatile semiconductor memories. With regard to these EEPROMs, the technique of forming control gates in a silicide form (siliciding control gates) is widely known. However, as devices become progressively smaller, continuing to employ this conventional configuration using silicide can lead to EEPROMs of ever declining reliability.

BRIEF DESCRIPTION OF THE DRAWINGS

FIG. 1 is a circuit diagram of a memory cell array of a NAND flash memory according to one embodiment;

FIG. 2 is a cross-sectional view of the memory cell array according to the embodiment;

FIG. 4 to FIG. 9 are a cross-sectional view showing a first to sixth manufacturing step of the NAND flash memory according to the embodiment;

FIG. 10 to FIG. 14 are a cross-sectional view of a memory cell according to a modification of the embodiment; and FIG. 15 and FIG. 16 are a cross-sectional view of a memory cell array according to a modification of the embodiment.

DETAILED DESCRIPTION

Figure 3:
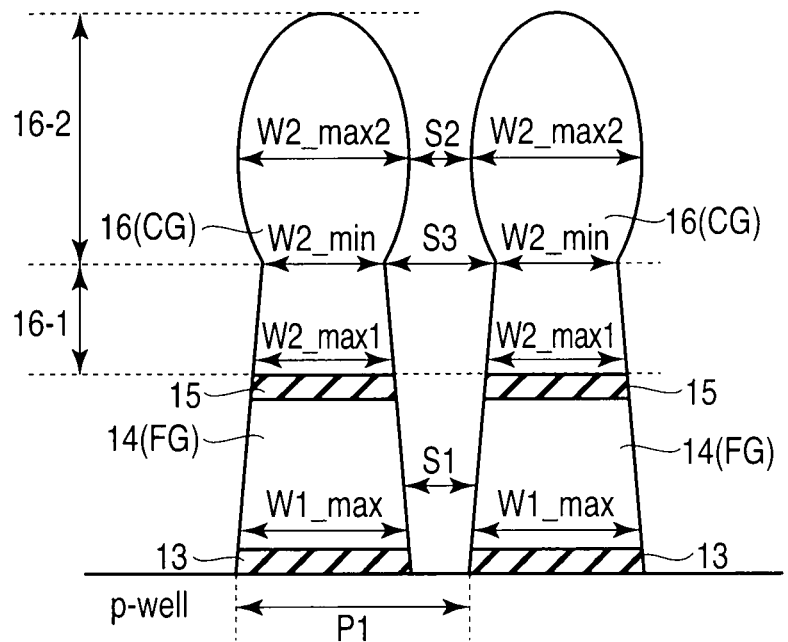
FIG. 3 is a cross-sectional view of a memory cell according to the embodiment.

Embodiments will be described below with reference to the drawings. In the description, in all of the drawings, common reference numbers denote common parts.

In general, according to one embodiment, a semiconductor storage device includes a charge storage layer, a control gate. The charge storage layer is formed above a semiconductor substrate with first insulating film disposed therebetween. The control gate is formed above the charge storage layer with second insulating film disposed therebetween. The control gate includes a nickel silicide region. The side surface of the control gate expands outwardly in at least a partial region thereof, and height of the control gate from a portion at which the side surface thereof starts to expand outwardly to a top of the control gate is greater than maximum width of the control gate in a region above the portion at which the side surface starts to expand outwardly.

The semiconductor storage device according to the embodiment is explained below taking a NAND flash memory as an example.

1. Configuration

First, the configuration of the NAND flash memory is explained.

1.1 Circuit Configuration of Memory Cell Array

The circuit configuration of the memory cell array provided in the NAND flash memory according to this embodiment is explained with reference to FIG. 1. FIG. 1 is a circuit diagram showing a partial region of the memory cell array.

As shown in the drawing, the memory cell array 1 includes a plurality of NAND cells 2. For example, each of the NAND cells 2 includes 32 memory cell transistors MT (referred to as MT0 to MT31 when it is necessary to distinguish them from one another) and select transistors ST1, ST2. The memory cell transistor MT has a stacked gate that includes a charge storage layer (for example, a floating gate) formed above the semiconductor substrate with a gate insulating film disposed therebetween, and a control gate formed above the floating gate with a gate-gate insulating film disposed therebetween. The number of memory cell transistors MT is not limited to 32 or any other specified number, and can be set to 8, 16, 64, 128, 256 or the like. Adjacent memory cell transistors MT commonly have the source or drain. The current paths of the memory cell transistors MT are serially connected between select transistors ST1 and ST2. The drain region on one-end side of the series-connected memory cell transistors MT is connected to the source region of select transistor ST1 and the source region on the other end side thereof is connected to the drain region of select transistor ST2.

The control gates of the memory cell transistors MT arranged on the same row are commonly connected to a corresponding one of word lines WL (WL0 to WL31). Further, the gates of the select transistors ST1, ST2 arranged on the same row are respectively commonly connected to select gate lines SGD, SGS. The drains of select transistors ST1 are respectively connected to bit lines BL (BL0 to BLm, m is a natural number) and the sources of select transistors ST2 are commonly connected to a source line SL.

Data items of a plurality of NAND cells 2 that commonly utilize the word lines WL and select gate lines SGD, SGS are simultaneously erased, such a unit constituting a block. In FIG. 1, only one block is shown, but a plurality of blocks are contained in the memory cell array 1 and a plurality of NAND cells 2 are connected to one bit line BL. Further, data is simultaneously written to the memory cell transistors MT that are connected to the same word line WL, such a unit constituting a page.

1.2 Cross-Sectional Configuration of NAND Cell 2

Next, the cross-sectional configuration of the NAND cell 2 with the above configuration is explained with reference to FIG. 2. FIG. 2 is a cross-sectional view of the memory cell 2 according to this embodiment in a direction along the bit line BL.

As shown in the drawing, an n-type well region 11 is formed in the surface region of a p-type semiconductor (silicon) substrate 10 and a p-type well region 12 is formed in the surface region of the well region 11. Gate electrodes of the memory cell transistors MT and select transistors ST1, ST2 are formed above the well region 12 with respective gate insulating films 13 disposed therebetween.

Each of the gate electrodes of the memory cell transistors MT and select transistors ST1, ST2 has a stacked gate structure that includes a polysilicon layer 14 formed on the gate insulating film 13, a gate-gate insulating film 15 formed on the polysilicon layer 15 and a metal silicide layer 16 formed on the gate-gate insulating film 15.

In the memory cell transistor MT, the polysilicon layer 14 functions as a charge storage layer (for example, a floating gate [FG]). Further, the silicide layer 16 functions as a control gate (CG). The control gates that are arranged adjacent in a direction intersecting at right angles with the bit line BL are commonly connected and function as a word line WL. For example, a material that forms the silicide layer 16 is NiSi. In the following description, the polysilicon layer 14 and silicide layer 16 of the memory cell transistor MT may be respectively referred as the charge storage layer 14 and control gate 16. The control gate 16 has a shape in which the corner portions of the upper portion are curved and whose side surface expands outwardly with respect to the lower portion. The shape of the control gate 16 will be explained in detail later.

In the select transistors ST1, ST2, the polysilicon layers 14 and silicide layers 16 that are adjacent in a direction extending along the word line are commonly connected. The polysilicon layers 14 and silicide layers 16 respectively function as the select gate lines SGS, SGD. Only the polysilicon layer 14 may function as the select gate line. In this case, the potential of the silicide layer 16 of each of the select transistors ST1, ST2 may be set at constant potential or in a floating state. The silicide layer 16 of each of the select transistors ST1, ST2 has a curved shape in which the corner portions are rounded. The upper surface of the silicide layer 16 of each of the select transistors ST1, ST2 is set at approximately the same level as the upper surface of the silicide layer 16 of the memory cell transistor MT, but may be set higher or lower than the latter. Further, the distance between the stacked gates of the adjacent memory cell transistors MT (that is, the distance between the adjacent word lines WL) is set to be less than or equal to the distance between the stacked gate of select transistor ST1 or ST2 and the stacked gate of the memory cell transistor MT adjacent thereto (that is, the distance between the word line WL and the select gate line SGD or the distance between the word line WL and the select gate line SGS). In the former case, for example, the distance between the adjacent word lines is set to half the distance between the select gate line and the word line.

In the surface regions of the well region 12 that lie between the respective gate electrodes, n-type impurity diffusion layers 17 are formed. Each impurity diffusion layer 17 is commonly used by adjacent transistors and functions as a source (S) or drain (D). Further, the region between the source and the drain that are formed adjacent to each other functions as a channel region used as an electron moving region. MOS transistors used as the memory cell transistors MT and select transistors ST1, ST2 are formed using the gate electrodes, impurity diffusion layers 17 and channel regions.

Sidewall insulating films 18 are formed on the sidewalls of the gate electrodes. The sidewall insulating films 18 are filled in spaces between the respective gate electrodes of the adjacent memory cell transistors MT and in spaces between the gate electrodes of the memory cell transistors MT and the select transistors ST1, ST2 adjacent thereto. The sidewall insulating film 18 is formed to extend from the surface of the semiconductor substrate 10 or the upper end of the gate insulating film 13 to the height corresponding to an intermediate portion of the control gate 16. In other words, the upper surface of the sidewall insulating film 18 is set in a position higher than the upper surface of the gate-gate insulating film 15 and lower than the upper surface of the control gate 16.

Further, in each region between the gate electrodes of the adjacent select transistors, an insulating film 19 is formed.

An interlaid insulating film 20 is formed on the semiconductor substrate 10 to cover the memory cell transistors MT and select transistors ST1, ST2. In the interlaid insulating film 20, a contact plug CP1 that reaches the impurity diffusion layer (source) 17 of select transistor ST2 on the source side is formed. A metal interconnection layer 21 connected to contact plug CP1 is formed on the interlaid insulating film 20. The metal interconnection layer 21 functions as the source line SL. Further, in the interlaid insulating film 20, a contact plug CP2 that reaches the impurity diffusion layer (drain) 17 of select transistor ST1 on the drain side is formed. A metal interconnection layer 22 connected to contact plug CP2 is formed on the interlaid insulating film 20. The metal interconnection layer 22 is connected to the bit line BL formed on an upper-level region (not shown).

1.3 Detail of Gate Electrode of Memory Cell Transistor MT

Next, the configuration of the gate electrode of the memory cell transistor MT according to this embodiment is explained in detail with reference to FIG. 3. FIG. 3 is a cross-sectional view of the gate electrodes of the memory cell transistors MT in a direction along the bit line BL.

As shown in the drawing, the control gate 16 has a shape in which at least the upper portion expands outwardly with respect to the lower portion (or charge storage layer 14). In other words, as shown in the drawing, the control gate 16 includes a first region 16-1 on the gate-gate insulating film 15 and a second region 16-2 on the first region 16-1. Further, the boundary between the first region 16-1 and the second region 16-2 is a portion in which the side surface of the control gate 16 substantially starts to expand. The sidewall of the first region 16-1 of the stacked gate is formed to be tapered and the width thereof (relative to the channel length) becomes narrower in a higher portion. The width of the control gate 16 (relative to the channel length [this applies to the following description]) is minimized at the boundary between the first region 16-1 and the second region 16-2.

Suppose now that the width of the charge storage layer 14 (relative to the channel length [this applies to the following description]) is set to W1 and the width of the control gate 16 is set to W2. Then, since the stacked gate is tapered, width W1 of the charge storage layer 14 is set to the maximum value W1_max in a portion that makes contact with the gate insulating film 13.

Further, since the sidewall of the control gate 16 is tapered, the width of the first region 16-1 is set to the maximum value W2_max1 in a portion that makes contact with the gate-gate insulating film 15. As described before, the control gate 16 has the minimum value W2_min at the boundary between the first region 16-1 and the second region 16-2, that is, in a portion in which the sidewall starts to expand. The maximum value W2_max2 in the second region 16-2 is set greater than W2_min. In this embodiment, W2_max2 is set to be less than W2_max1 (however, the relationship therebetween may be inversed or the values may be set equal to each other).

The height of the control gate 16 from a portion in which the side surface of the control gate 16 starts to expand to the top of the control gate 16 or height H1 of the second region 16-2 is set greater than W2_max2. That is, H1>W2_max2, and therefore, H1>W2_min. Further, H1 may be set greater than W1_max. It is sufficient if H1 is set greater than W1_max2, and more preferably, it is desirable to set H1 three times W1_max2 (H1:W2_max2=2:1) or more.

That is, the following expressions are set in the stacked gate of the memory cell transistor MT.

$$W1\_max > W2\_max2 \geq W2\_max1 > W2\_min \quad (1)$$

$$H1 > W2\_max2 \quad (2)$$

where W1_max is the maximum width of the charge storage layer 14,

W2_max1 is the maximum width of the first region 16-1 of the control gate 16,

W2_max2 is the maximum width of the second region 16-2 of the control gate 16,

W2_min is the minimum width of the control gate 16 and the width in the boundary portion between the first region 16-1 and the second region 16-2, and H1 is the height of the second region 16-2 of the control gate 16.

However, this applies only to the configuration according to this embodiment and it is sufficient if the above expression (2) is satisfied. Even if part of the expression (1) is not satisfied, there occurs no problem. That is, if the second region 16-2 has a shape in which it starts to expand outwardly in a portion that makes contact with the first region 16-1, the configuration is not particularly limited.

Further, the half pitch of the stacked gates of the memory cell transistors MT is set to approximately 30 nm or less. The half pitch is equal to half the sum of the width of the stacked gate and the distance between the adjacent stacked gates. In other words, the half pitch is equal to half the sum of the line width of the word line WL and the distance between the adjacent word lines WL. For example, if the distance between the adjacent charge storage layers 14 is set to S1 and (W1+S1)=P1, then the half pitch is set to P1½. Therefore, when the half pitch is 30 nm, S1, W1, W2 are set to approximately 30 nm. However, for example, S1 may be set to exceed 30 nm, and W1, W2 may be set to less than 30 nm, and the reverse relationship may be similarly applied.

In the second region 16-2, the side surface thereof expands outwardly (towards the adjacent stacked gate). Therefore, distance S2 between the adjacent second regions 16-2 in a portion of the second region 16-2 that has the maximum width W2_max2 is set to be less than distance S3 therebetween in a portion in which the second region 16-2 and the first region 16-1 contact each other. However, in this embodiment, distance S2 is set to be less than the distance in a portion in which the charge storage layer 14 has the maximum width W1_max.

Although not shown in FIG. 3, the upper surface of the sidewall insulating film 18 (refer to FIG. 2) is set in a position corresponding to the boundary portion between the first region 16-1 and the second region 16-2. That is, the control gate 16 starts to expand outwardly from a portion of the height corresponding to the upper surface of the sidewall insulating film 18.

2. Manufacturing Method

Next, the manufacturing method of the NAND cells 2 with the above configuration is explained with reference to FIG. 4 to FIG. 9. FIG. 4 to FIG. 9 are cross-sectional views sequentially showing the manufacturing steps of the NAND cells 2 according to this embodiment. FIG. 4 to FIG. 9 are cross-sectional views showing a forming region of memory cell transistors MT29 to MT31 and a select transistor ST1 along the direction of the bit line BL in this region.

Figure 4:
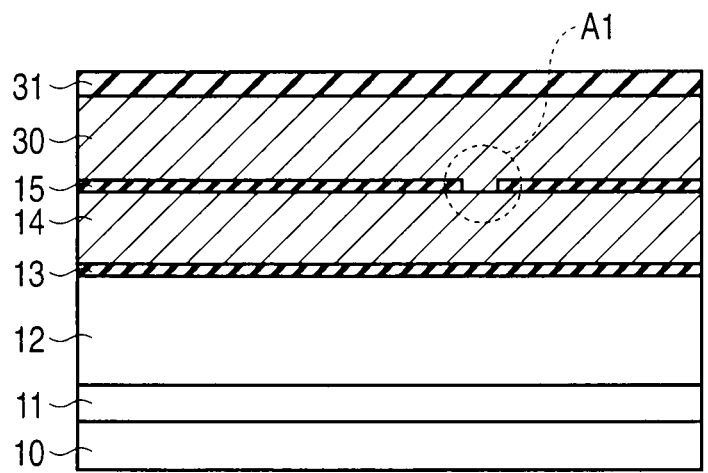

First, as shown in FIG. 4, for example, n-type impurities are injected into the surface region of a p-type silicon substrate to form an n-type well region 11 and p-type impurities are injected into the surface region of the well region 11 to form a p-type well region 12. Then, for example, a gate insulating film (tunnel insulating film) 13 is formed on the well region 12 by means of a thermal oxidation or CVD method. For example, the gate insulating film 13 is formed by using a silicon oxide film, oxynitride film or silicon nitride film as a material. Subsequently, a conductive film such as a polysilicon layer 14 is formed on the gate insulating film 13 by means of the CVD method, for example.

Next, in a region that is not shown in FIG. 4, the polysilicon layer 14, gate insulating film 13 and well region 12 are selectively etched out by means of the photolithography process and etching technique to form trenches that divide NAND cells 2. After this, insulating films are filled in the trenches to form element isolation regions.

Then, as shown in FIG. 4, a gate-gate insulating film 15 is formed on the polysilicon layer 14 and element isolation regions. For example, the gate-gate insulating film 15 is formed of a single-layered silicon nitride film or silicon oxide film or a laminated structure including the above films, or a laminated structure including, for example, an ONO film, NONON film or $TiO_2$, $HfO_2$, $Al_2O_3$, $HfAlO_x$, HfAlSi or HfSi film and silicon oxide film or silicon nitride film. Subsequently, for example, a polysilicon layer 30 is formed on the gate-gate insulating film 15 by means of the CVD method. At this time, at least part of the gate-gate insulating film 15 is removed in a forming region of the select transistors ST1, ST2 (refer to a region A1 in FIG. 4). After this, a mask material 31 is formed on the polysilicon layer 30. For example, the mask material 31 is formed by using a silicon nitride film or a laminated insulating film of a silicon nitride film and silicon oxide film as a material.

Next, as shown in FIG. 5, the mask material 31, polysilicon layer 30, gate-gate insulating film 15, polysilicon layer 14 and gate insulating film 13 are etched into a pattern of word lines WL by means of the photolithography technique and RIE. As described before, at this time, the etching process is performed to set the half pitch of the word lines WL to 30 nm or less. As a result, the stacked gates of the memory cell transistors MT and select transistors ST1, ST2 are formed. At this time, the sidewall of the stacked gate of the memory cell transistor MT is formed to be tapered. Not only the sidewall of the stacked gate of the memory cell transistor MT but also the sidewall of the stacked gate of the select transistors ST1, ST2 may be tapered. Further, it is possible not to etch the gate insulating film 13.

Then, as shown in FIG. 5, for example, phosphorus, arsenic or antimony is ion-implanted into the surface region of the well region 12. At this time, the mask material 31 and polysilicon layers 30, 14 function as a mask for ion-implantation. As a result, as shown in the drawing, n-type impurity diffusion layers 17 functioning as source and drain regions are formed in the surface region of the well region 12.

Next, as shown in FIG. 6, an insulating film is formed on the well region 12 and the upper surfaces and side surfaces of the stacked gates and is then selectively etched by means of RIE, for example, to form sidewall insulating films 18. Each sidewall insulating film 18 is formed to completely fill a space between the adjacent stacked gates. The sidewall insulating film 18 is formed using a material such as a silicon oxide film or silicon nitride film that has a selective etching ratio with respect to the polysilicon layers 14, 30. Subsequently, an insulating film 19 is formed on the semiconductor substrate 10 to cover the stacked gates. After this, the insulating film 19 is polished by means of the CMP method or the like to expose the upper surface of the mask material 31. As a result, the insulating film 19 remains in each space between the stacked gates of the adjacent select transistors.

Next, as shown in FIG. 7, the insulating films 19, sidewall insulating films 18 and mask material 31 are etched by means of the RIE method or the like. As a result, the mask material 31 is removed and the upper surfaces of the polysilicon layers 30 are exposed. Further, the upper surfaces of the insulating films 18, 19 are set lower than the upper surfaces of the polysilicon layers 30 and set higher than the upper surfaces of the polysilicon layers 14 or gate-gate insulating films 15. As a result, at least a portion of the side surface of the polysilicon layer 30 in the upper portion thereof is exposed.

Next, as shown in FIG. 8, a metal layer, for example, a Ni layer 32 in this embodiment is formed on a region exposed in the step of FIG. 7.

Figure 9:
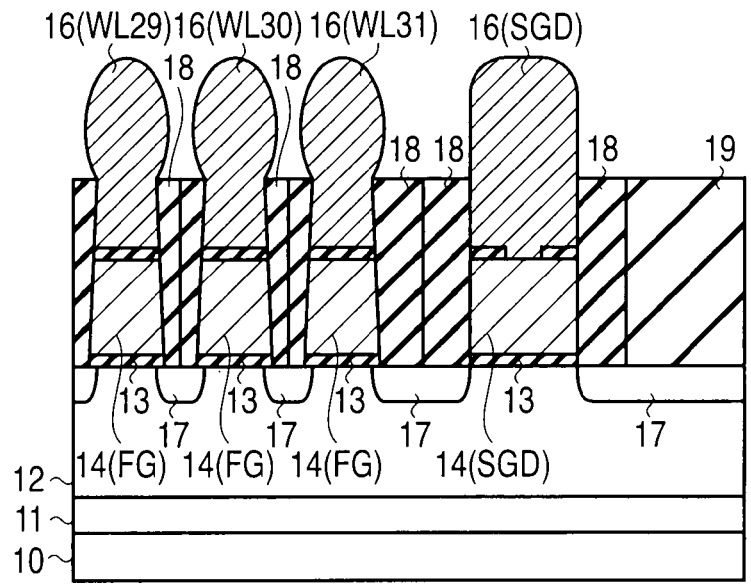

Then, as shown in FIG. 9, the heat treatment is performed to form the polysilicon layers 30 into a silicide form. That is, by the heat treatment, Ni atoms in the Ni layer 32 are diffused into the polysilicon layers 30 to modify the polysilicon layers 30 to NiSi layers 16. At this time, since the Ni layer 32 is also formed on the side surfaces of the polysilicon layers 30, silicidation proceeds not only from the upper surfaces of the polysilicon layers 30 but also from the side surfaces thereof. As a result, with the configuration of this embodiment, all of the polysilicon layers 30 of the memory cell transistors MT are silicided.

The silicided amount of the polysilicon layers 30 can be controlled according to the etching amount of the sidewall insulating films 18 in the step of FIG. 7. That is, if the etching amount of the sidewall insulating film 18 is small, the contact area between the side surface of the polysilicon layer 30 and the Ni layer 32 becomes small. Therefore, only the upper region of the polysilicon layer 30 is silicided. On the other hand, if the etching amount of the sidewall insulating film 18 is set large, the contact area between the side surface of the polysilicon layer 30 and the Ni layer 32 becomes large. Therefore, the entire region of the polysilicon layer 30 is silicided. If the etching amount of the sidewall insulating film 18 is set excessively large, silicidation may also occur in the polysilicon layers 14 in the select transistors ST1, ST2. Therefore, it becomes necessary to adequately control the etching amount of the sidewall insulating film 18.

Further, the NiSi layer 16 gets thicker by the heat treatment. The expanded region is a region that does not make contact with the sidewall insulating film 18. That is, in a region that makes contact with the sidewall insulating film 18, expansion of the NiSi layer 16 is suppressed by the presence of the sidewall insulating film 18. On the other hand, in the region that does not make contact with the sidewall insulating film 18, the NiSi layer 16 expands in the vertical and horizontal directions in FIG. 9 and the corner portions thereof are formed into a curved shape. As a result, as explained in FIG. 3, control gates 16 each having a width (relative to the channel length) of the minimum value at the boundaries between the first regions 16-1 and the second regions 16-2 are completed. The position of the boundary between the first region 16-1 and the second region 16-2 can be controlled according to the position of the upper surface of the sidewall insulating film 18. That is, the position of the boundary between the first region 16-1 and the second region 16-2 is set at approximately the same level as the position of the upper surface of the sidewall insulating film 18.

In the above process, the memory cell transistors MT and select transistors ST1, ST2 are completed. After this, an interlaid insulating film 20 that covers the memory cell transistors MT and select transistors ST1, ST2 is formed on the semiconductor substrate 10 and required contact plugs and metal interconnection layers are formed to complete the configuration of FIG. 2.

3. Effect According to Embodiment

As described above, with the semiconductor storage device according to this embodiment, the operating reliability can be enhanced. The effect is explained below.

3.1 Conventional Configuration

In a NAND flash memory, a voltage is applied to the control gate to write, read and erase. Therefore, it is necessary to set the resistance of the control gate sufficiently low. It is normal to form the control gate using a laminated film of a metal layer and semiconductor layer or an alloy layer of metal and semiconductor. However, with the above configuration, the following problems (a and b) occur.

(a) First, a case wherein the control gate is formed using a laminated film of a metal layer and semiconductor layer is explained. In this case, after a metal layer and semiconductor layer are laminated, and then the layers can be simultaneously processed. However, the radius of curvature of the corner portion of the control gate becomes smaller. Therefore, an electric field is concentrated at the corner portion of the control gate. As a result, the withstand voltage between the word lines is reduced and the operating reliability is degraded. Further, with the above configuration, it is difficult to use low resistance metal of cobalt (Co) or nickel (Ni) as the metal layer. This is because the above metal is difficult to etch into a pattern of word line.

(b) Next, a case wherein the control gate is formed using an alloy of metal and semiconductor is explained. In this configuration, an alloy (CoSi) of Co and Si is widely used. In this case, after a Co layer is formed on a polysilicon layer, the heat treatment is performed to form an alloy. However, the volume of Co shrinks when alloyed with Si.

Therefore, if an attempt is made to attain the sufficiently large cross-sectional area of the control gate to reduce the resistance thereof, it is necessary to increase the width (the width in a direction in which the control gate 16 of FIG. 2 expands, this applies in the following description if notification is not particularly given). Then, if the width of the charge storage layer becomes greater under a condition that the half pitch is kept constant, the distance between the adjacent charge storage layers becomes smaller. As a result, the following problems occur:

(b1) Interference due to the capacitive coupling between the charge storage layers becomes large. Therefore, erroneous reading or writing tends to occur.

(b2) Charges tend to escape from the charge storage layer because of leakage between the charge storage layer and the adjacent control gate during a write.

(b3) If the distance between the word lines becomes smaller, an electric field caused by a voltage of the control gate adjacent to a selected memory cell transistor MT affects the channel of the selected memory cell transistor MT and the neutral threshold voltage of the memory cell transistor MT is reduced. The neutral threshold voltage indicates a threshold voltage in a state in which no charges are stored in the charge storage layer. That is, during a read, a high voltage used to turn on the memory cell transistor MT is applied to an unselected word line WL. The neutral threshold voltage of a selected (to-be-read) memory cell transistor MT is reduced under the influence of the high voltage. In the NAND flash memory, data is written by injecting charges into the charge storage layer to raise the threshold voltage of the memory cell transistor MT. Suppose that the neutral threshold voltage is Vth and the raised threshold voltage after a write is set to Vth_prog. As the difference between Vth and Vth_prog becomes greater, the degree of reduction of Vth_prog over time becomes greater. As a result, data retention is degraded.

(b4) Ion-implantation for formation of sources and drains is obstructed. That is, since the distance between adjacent charge storage layers becomes less, it becomes difficult to inject sufficient ions into the semiconductor substrate. As a result, the source and drain diffusion layers are separated from the gate and offset will occur.

3.2 Configuration According to Present Embodiment

In the configuration according to this embodiment, the control gate 16 is formed to expand outwardly. Such a configuration can be realized by using NiSi as a material of the control gate 16 and setting the half pitch of the word line WL to 30 nm or less. As a result, the problem explained in the item 3.1 can be solved.

(a) The control gate 16 according to this embodiment has a shape in which the upper portion (second region 16-2) expands with respect to the lower portion (first region 16-1). Therefore, the cross-sectional area of the control gate 16 can be increased and the resistance can be sufficiently reduced. Further, usage of Ni that is low-resistance metal can contribute to a reduction in the resistance. The corner portions of the control gate 16 are curved and the radius of curvature thereof is made greater. Therefore, an electric field do not concentrate in the corner portions of the control gate 16 and the withstand voltage between the word lines can be raised.

In this embodiment, the cross-sectional area of the control gate 16 is increased without making width of the control gate in the lateral direction after expansion be large more than needed by taking the large aspect ratio of a control gate. As a result, the adjacent control gates 16 can be prevented from making contact with each other in the expanded portions and there is no obstruction to the miniaturization of the memory cell transistor MT.

(b) With the configuration according to this embodiment, since the resistance of the control gate 16 can be made sufficiently low, it is unnecessary to increase the width of the charge storage layer 14 as described in the item 3.1(b). That is, the distance between the adjacent charge storage layers 14 can be made sufficiently great. Therefore, the problem of item 3.1 (b) can be suppressed.

(b1) Interference due to the capacitive coupling between the charge storage layers 14 becomes small. As a result, erroneous reading or writing becomes unlikely.

(b2) Leakage between the charge storage layer and the adjacent control gate can be reduced during a write. Therefore, escape of charges from the charge storage layer can be suppressed.

(b3) An electric field caused by a voltage of the control gate adjacent to a selected memory cell transistor MT becomes difficult to give an influence to the channel of the selected memory cell transistor MT at the read time. This is because the distance from the control gate adjacent to the selected memory cell transistor MT to the channel of the selected memory cell transistor MT can be increased. As a result, a reduction in the neutral threshold voltage of the memory cell transistor MT caused by the voltage of the adjacent control gate can be prevented. Therefore, the difference between Vth and Vth_prog can be prevented from becoming greater or the difference between Vth and Vth_prog can be set small, and data retention is enhanced.

(b4) With the configuration explained in FIG. 5, since the distance between the stacked gates can be increased, ions can be sufficiently injected into the well region 12. As a result, the source and drain diffusion layers are kept from being separated from the gate and the ion-implantation efficiency can be improved.

4. Modification or the Like

As described above, the NAND flash memory according to the embodiment includes the charge storage layers 14 (FG) formed above the semiconductor substrate 10 with the first insulating films 13 disposed therebetween and the control gates 16 (CG) formed on the respective charge storage layers 14 with the second insulating films 12 disposed therebetween. The control gate 16 has a shape in which the side surface expands outwardly in at least a partial region (second region 16-2) thereof. Further, height H1 from a portion of the control gate 16 at which the side surface starts to expand to the top portion of the control gate 16 is set greater than the maximum width W2_max2 of the control gate 16 in a region (second region 16-2) lying above the portion at which the side surface starts to expand.

In other words, the control gate 16 includes the first region 16-1 formed on the second insulating film 15 and the second region 16-2 on the first region 16-1. Height H1 of the second region 16-2 is set greater than the maximum width W2_max2 of the second region 16-2.

With the above configuration, the resistance of the control gate can be sufficiently low and the distance between the adjacent charge storage layers can be set large. Therefore, even when the semiconductor storage device is further miniaturized, the operating reliability thereof can be enhanced.

The embodiment explained above is not only one embodiment and various modifications can be made. Some of them are explained below.

4.1 Material of Stacked Gate

Figure 10:
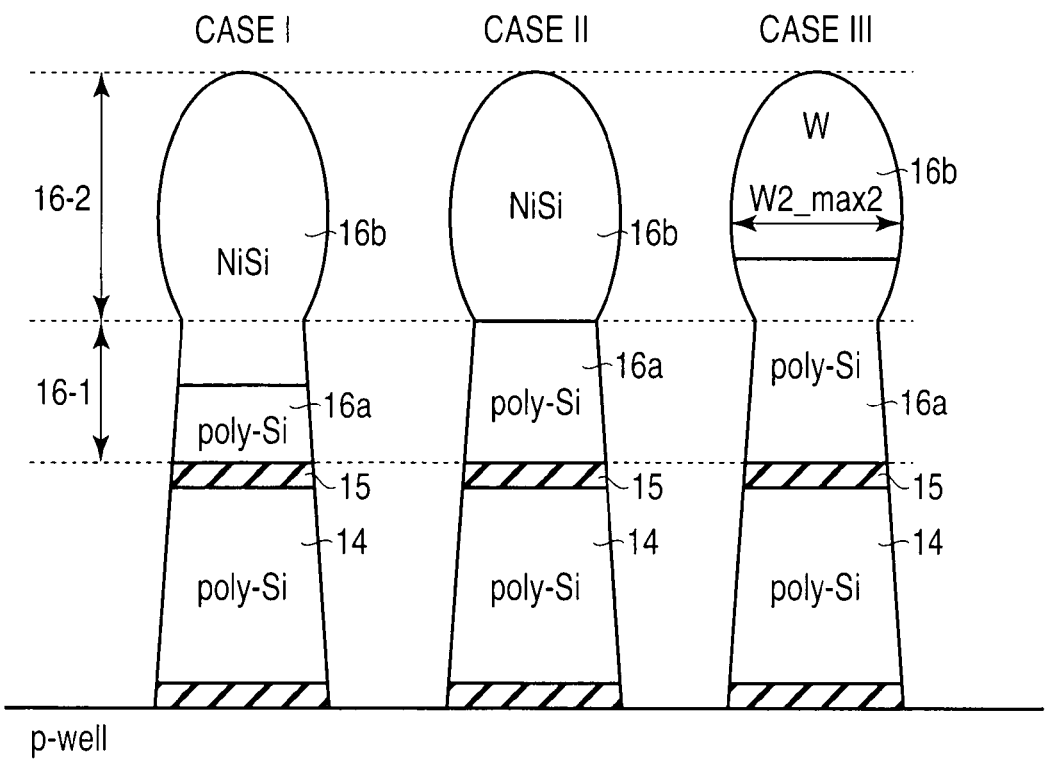

In the above embodiment, a case wherein all of the polysilicon layers 16 used as the control gates are formed into a silicide form is explained as an example. However, only a part of the polysilicon layer 16 may be formed into a silicide form. That is, in this case, the control gate is formed to have a laminated structure of a polysilicon layer and NiSi layer. Such an example is shown in FIG. 10. FIG. 10 is a cross-sectional view of stacked gates of memory cell transistors MT. As described before, the amount of the control gate 16 that is formed into a silicide form can be controlled according to the amount of etching of the sidewall insulating film 18 in the step of FIG. 7.

In Case I in the drawing, a polysilicon layer 16a is left behind in the lower region of the first region 16-1 and the upper region of the first region 16-1 and the entire region of the second region 16-2 are formed into a silicide form (NiSi layer 16b).

In Case II, a polysilicon layer 16a is left behind in the first region 16-1 and the second region 16-2 is formed into a silicide form. That is, the boundary between the first region 16-1 and the second region 16-2 acts as the boundary between the polysilicon layer 16a and the NiSi layer 16b.

Further, in Case III, a polysilicon layer 16a is left behind not only in the first region 16-1 but also in the lower region of the second region 16-2 and metal, for example, tungsten is formed only on the upper region of the second region 16-2. In Case III, it is desirable to form metal on a region ranging from a portion that is set in a position corresponding to the height at which at least the second region 16-2 takes the maximum width W2_max2 to the upper portion thereof. This is performed to reduce the resistance of the control gate. Thus, in this embodiment, not only silicide but also metal can be applied.

As is explained with reference to FIG. 2 and FIG. 3 in the above embodiment, even when the entire surface of the control gate 16 is formed into a silicide form as viewed from above the well region 12, the polysilicon layer 16*a* may be left behind in a region between the adjacent NAND cells 2. Such an example is shown in FIG. 11. FIG. 11 is a cross-sectional view of a partial region of the memory cell array 1 in a direction along the word line WL.

As shown in the drawing, in the surface region of the well region 12, element isolation regions STI are formed and regions between the respective element isolation regions STI act as element regions AA. On the element regions AA, memory cell transistors MT and select transistors ST1, ST2 are formed. That is, a charge storage layer 14 (polysilicon layer) is formed above the element region AA with a gate insulating film 13 disposed therebetween. The upper surface of the charge storage layer 14 is set higher than the upper surface of the element isolation region STI. A gate-gate insulating film 15 is formed along the upper surfaces and side surfaces of the charge storage layers 14 and the element isolation regions STI. That is, the gate-gate insulating film 15 has a shape having concave portions on the element isolation regions STI. Further, a control gate 16 is formed on the gate-gate insulating film 15.

With the above configuration, portions of the control gate 16 in regions directly above the element regions AA are entirely formed into a silicide form. That is, the NiSi layer 16*b* is formed in contact with the gate-gate insulating film 15. On the other hand, in regions directly above the element isolation regions STI, regions (polysilicon layers 16*a*) that are not formed into a silicide form are left behind. In the above region, the upper surface of the polysilicon layer 16*a* is set lower than the upper surface of the gate-gate insulating film 15, for example. The memory cell transistor MT may have the above configuration.

Further, in the above embodiment, a case wherein the NiSi layer is used as the silicide layer is explained as an example. However, the silicide layer is not limited to NiSi and may be formed of another metal alloy film such as CoSi or WSi.

In FIG. 10 and FIG. 11, a case wherein the control gate 16 is formed with a multi-layered structure of the polysilicon layer 16*a* and silicide layer 16*b* is explained as an example. However, the control gate may be formed with a multi-layered structure of a metal layer and polysilicon layer. As the metal layer, tungsten (W) or the like may be used. The configuration of the control gate 16 having a multi-layered structure of a metal layer and polysilicon layer is obtained by replacing the silicide layer 16*b* by the metal layer in FIG. 10 and FIG. 11.

4.2 Structure of Stacked Gate

The stacked gate of the memory cell transistor MT may be formed to have various shapes. Such an example is shown in FIG. 12. FIG. 12 is a cross-sectional view of the stacked gates of the memory cell transistors MT.

In Case IV in the drawing, the side surfaces of the charge storage layer 14 and control gate are approximately perpendicular to the surface of the semiconductor substrate. In other words, the width of the charge storage layer 14 is substantially the same as the width of the first region 16-1 of the control gate 16. In this case, W2_min may be set as the width of the first region 16-1 in a portion that makes contact with the second region 16-2 or the width of the first region 16-1 in another portion.

In Case V in the drawing, concave portions (regions A2 in the drawing) are formed at the boundary portion between the first region 16-1 and the second region 16-2 of the control gate 16. In other words, a third region 16-3 having width W3 smaller than W2_min is formed between the first region 16-1 and the second region 16-2. In this case, H1 may be set as the height of only the second region 16-2 or the sum of the height of the second region 16-2 and the height of the third region 16-3. Further, H1 may be defined as the height from a portion of the third region 16-3 at which width W3 is set to the minimum value to the top of the second region 16-2.

The configurations of Cases IV and V may be combined with the configurations shown in FIG. 10 and FIG. 11.

Figure 13:
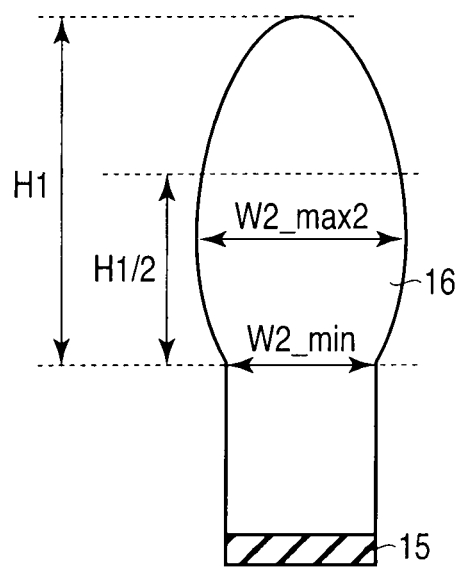

The control gate 16 may be formed with a configuration of FIG. 13. FIG. 13 is a cross-sectional view of the control gate 16. As shown in the drawing, a portion of the second region 16-2 at which the maximum width W2_max2 is set is set in a position lower than the height that is half height H1. As a result, the radius of curvature of the upper corner portion of the second region 16-2 becomes greater. Therefore, concentration of an electric field in the corner portion of the control gate 16 can be more effectively reduced and the withstand voltage between the word lines can be enhanced.

Figure 14:
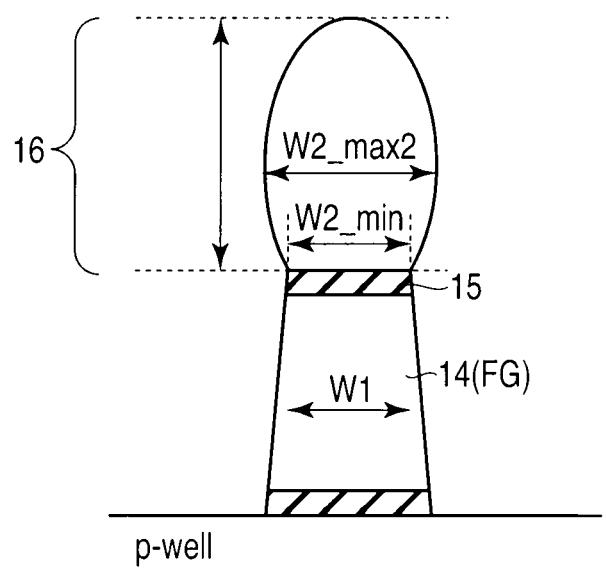

Further, the control gate 16 may be formed with the configuration that does not include the first region 16-1. An example is shown in FIG. 14. As shown in the drawing, the control gate 16 may outwardly expand from a region in which the control gate makes contact with the gate-gate insulating film 15. In this case, width W2_min can be defined as the width of a portion that makes contact with the gate-gate insulating film 15 and height H1 can be defined as the height from a portion that makes contact with the gate-gate insulating film 15 to the top of the second region 16-2.

Further, the sidewall insulating films 18 that fill spaces between the respective stacked gates may contain cavities. An example is shown in FIG. 15. FIG. 15 is a cross-sectional view of a NAND cell 2. As shown in the drawing, the sidewall insulating films 18 do not completely fill the spaces between the respective stacked gates and cavities 33 are formed in the respective sidewall insulating films. In this case, it is desirable to set the upper portion of the cavity 33 lower than a portion (the boundary portion between the first region 16-1 and the second region 16-2) at which the side surface of the control gate 16 starts to be constricted. In other words, it is desirable not to expose the cavities 33 when the sidewall insulating films 18 are etched in the step of FIG. 7. This is because migration of metal layers 32 occurs if the metal layers 32 are formed in the cavities 33 in the later step and the reliability may be degraded by short-circuiting between adjacent cells.

Further, cavities 34 may be formed above the cavities 33. FIG. 16 is a cross-sectional view of a NAND cell 3. NAND cell 3 has a modified structure of NAND cell 2. The difference between NAND cell 2 and NAND cell 3 lies in the stacked gate structure and in that the cavities 34 are formed. Unlike NAND cell 2, the stacked gate structure corresponding to Case V of FIG. 12 is used as the stacked gate structure of NAND cell 3. The cavities 34 are formed between the control gates in an insulating film 20 formed on the sidewall insulating films 18. The cavities 34 are different from the cavities 33 of FIG. 15.

For example, the cavities 34 can be formed between the respective second regions 16-2 by utilizing a condition of bad coverage when the insulating film 20 is deposited. Therefore, for example, the cavities 34 are formed in positions that lie above the upper surfaces of the sidewall insulating films 18 and in which distance S2 between the adjacent control gates as explained in FIG. 3 is set. Because of formation of the cavity 34, line capacitance between the word lines can be reduced and high-speed operation can be performed. Since concave portions are formed in the boundary portion between the first region 16-1 and the second region 16-2 of the control gate 16 (the third region 16-3 is formed), the cavity 34 can be easily formed. Even in the stacked gate structure other than the structure of Case V, for example, the structure shown in FIG. 3, the cavities 34 can be formed depending on the deposition condition of the insulating film 20.

4.3 Others

As described above, this embodiment can be variously modified. Further, the shape of the control gate 16 explained in the above embodiment may be applied to the silicide layer 16 of the select transistor. In the above embodiment, a case wherein the NAND flash memory is taken as an example is explained. However, this embodiment can be applied to a NOR flash memory or other EEPROMs. At this time, the charge storage layer 14 may be formed of an insulating film instead of a conductive film (MONOS structure). Further, this embodiment can be applied not only to the EEPROM but also to a general semiconductor memory. This embodiment can be applied not only to the semiconductor memory but also to a MOS transistor. In addition, a material used to form the device is not limited to the material explained in the above embodiment and can be adequately selected. Also, the order of the manufacturing processes is not limited to the order explained in the above embodiment and can be exchanged as far as possible.

A method of manufacturing a semiconductor storage device comprising forming stacked gate including a charge storage layer and control gate on a semiconductor substrate; filling an insulating film between the adjacent stacked gates; removing portions of the insulating film ranging from the upper surface of the control gate to first height to expose the upper surface of the control gate; forming metal layer on the upper surface and side surface of the exposed control gate; and subjecting the control gate to heat treatment to expand the control gate and set height of the control gate greater than maximum width of the control gate.

In the above embodiment, NiSi is explained as an example, but Ni silicide may include the $NiSi_2$ phase, the $Ni_2Si$ phase or the like.

N-type impurity diffusion layers 17 are an arbitrary configuration though n-type impurity diffusion layers 17 are formed on the surface of the semiconductor substrate 10 in FIG. 2. When n-type impurity diffusion layers 17 are not formed in the surface of the semiconductor substrate 10, an electric current is passed in the semiconductor substrate 10 between word lines WL by using the fringe capacity from the control gates 16 (CG) and the charge storage layer 14 (FG).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a charge storage layer formed above a semiconductor substrate with a first insulating film disposed therebetween;
a control gate formed above the charge storage layer with a second insulating film disposed therebetween, the control gate including a nickel silicide region; and
an insulating film filling a space between adjacent stacked gates of memory cells, each of the stacked gates including the charge storage layer, the second insulating film, and the control gate to configure the memory cells,
wherein a side surface of the control gate expands outwardly to have an expanded shape in at least a partial region thereof, and a height of the control gate from a portion at which the side surface thereof starts to expand outwardly to a top of the control gate is greater than a maximum width of the control gate in a region above the portion at which the side surface starts to expand outwardly, and
a cavity is formed in each insulating film and a position of an upper end of the cavity is set lower than a position in which the side surface of the control gate starts to expand outwardly.

2. The device according to claim 1, wherein the control gate further including a silicon region.

3. The device according to claim 1, wherein the nickel silicide region of the control gate contacts with the second insulating film.

4. The device according to claim 1, wherein the control gate has the expanded shape in an upper region above an intermediate portion of the side surface thereof.

5. The device according to claim 4, wherein the control gate includes concave portions in the side surface in a portion in which the side surface starts to expand outwardly.

6. The device according to claim 1, wherein a position in which the control gate is formed with the maximum width is lower than a position corresponding to half the height of the control gate from a portion at which the side surface thereof starts to expand outwardly to a top of the control gate.

7. The device according to claim 1, wherein the nickel silicide region of the control gate contacts with the second insulating film, and the control gate has the expanded shape in an upper region above an intermediate portion of the side surface thereof.

8. The device according to claim 1, wherein the nickel silicide region of the control gate contacts with the second insulating film, and the control gate includes concave portions formed in the side surface in a portion in which the side surface thereof starts to expand outwardly.

9. The device according to claim 1, wherein the control gate has the expanded shape in an upper region above an intermediate portion of the side surface thereof, and the control gate includes concave portions formed in the side surface in a portion in which the side surface thereof starts to expand outwardly.

10. The device according to claim 1, wherein the nickel silicide region of the control gate contacts with the second insulating film, the control gate has the expanded shape in an upper region above an intermediate portion of the side surface thereof, and the control gate includes concave portions formed in the side surface in a portion in which the side surface thereof starts to expand outwardly.

11. A semiconductor storage device comprising:
a charge storage layer formed above a semiconductor substrate with a first insulating film disposed therebetween;

a control gate formed above the respective charge storage layer with a second insulating film disposed therebetween, the control gate including a nickel silicide region; and an insulating film filling a space between adjacent stacked gates of memory cells, each of the stacked gates including the charge storage layer, the second insulating film, and the control gate to configure the memory cells, wherein the control gate includes a first region on the second insulating film and a second region on the first region, a width of the first region is reduced as its position becomes higher, the width of the first region in a portion that makes contact with the second region is set to be less than a maximum width of the second region, and a height of the second region is set greater than the maximum width of the second region, and a cavity is formed in each insulating film and a position of an upper end of the cavity is set lower than a position in which the side surface of the control gate starts to expand outwardly.

12. The device according to claim 11, wherein at least the second region of the control gate is the nickel silicide region.

13. The device according to claim 11, wherein the nickel silicide region of the control gate contacts with the second insulating film.

14. The device according to claim 11, wherein a position in which the control gate is formed with the maximum width is lower than a position corresponding to half the height of the second region.

15. The device according to claim 11, wherein the control gate includes concave portions formed in the side surface at the boundary between the first region and the second region.

16. The device according to claim 11, wherein the nickel silicide region of the control gate contacts with the second insulating film and at least the second region of the control gate is the nickel silicide region.

17. The device according to claim 11, wherein the nickel silicide region of the control gate contacts with the second insulating film, and the control gate includes concave portions formed in the side surface at a boundary between the first region and the second region.

18. The device according to claim 11, wherein at least the second region of the control gate is the nickel silicide region, and the control gate includes concave portions formed in the side surface at a boundary between the first region and the second region.

19. The device according to claim 11, wherein the nickel silicide region of the control gate contacts with the second insulating film, at least the second region of the control gate is the nickel silicide region, and the control gate includes concave portions formed in the side surface at a boundary between the first region and the second region.

* * * * *